United States Patent
Kashihara et al.

(10) Patent No.: US 10,454,007 B2
(45) Date of Patent: Oct. 22, 2019

(54) LIGHT-EMITTING DEVICE AND METHOD FOR MANUFACTURING SAME

(71) Applicant: NICHIA CORPORATION, Anan-shi (JP)

(72) Inventors: Shoichi Kashihara, Komatsushima (JP); Masanobu Sato, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/005,580

(22) Filed: Jun. 11, 2018

(65) Prior Publication Data
US 2018/0358519 A1    Dec. 13, 2018

(30) Foreign Application Priority Data

Jun. 12, 2017  (JP) .................. 2017-114961
Apr. 2, 2018   (JP) .................. 2018-071079

(51) Int. Cl.
| | |
|---|---|
| H01L 33/58 | (2010.01) |
| H01L 33/56 | (2010.01) |
| H01L 33/50 | (2010.01) |
| G02B 5/02  | (2006.01) |

(52) U.S. Cl.
CPC ............ *H01L 33/58* (2013.01); *H01L 33/502* (2013.01); *H01L 33/56* (2013.01); *G02B 5/0226* (2013.01); *H01L 33/508* (2013.01); *H01L 2933/005* (2013.01); *H01L 2933/0041* (2013.01);
(Continued)

(58) Field of Classification Search
CPC ....... H01L 33/58; H01L 33/502; H01L 33/56; H01L 2933/0083; H01L 33/508; H01L 2933/005; H01L 2933/0058; H01L 2933/0091; H01L 2933/0041; G02B 5/0226
See application file for complete search history.

(56) References Cited

U.S. PATENT DOCUMENTS

| | | |
|---|---|---|
| 2002/0039001 A1 | 4/2002 | Nagai et al. |
| 2008/0030986 A1 | 2/2008 | Ogawa et al. |

(Continued)

FOREIGN PATENT DOCUMENTS

| | | |
|---|---|---|
| JP | 03-206673 | 9/1991 |
| JP | 2000-004050 | 1/2000 |

(Continued)

*Primary Examiner* — Victor A Mandala
(74) *Attorney, Agent, or Firm* — Mori & Ward, LLP

(57) ABSTRACT

A light-emitting device includes: a light-emitting element; a light-transmissive member that covers the light-emitting element; and a light-diffusing particles contained in the light-transmissive member. The light-diffusing particles are hollow and have a particle size not smaller than 50 μm. The light-transmissive member has a surface having irregularities associated with the light-diffusing particles. A method for manufacturing a light-emitting device includes steps of: mounting a light-emitting element in a recess of a base member; injecting a silicone resin containing light-diffusing particles into the recess, the light-diffusing particles having a particle size not smaller than 50 μm; causing the light-diffusing particles to float up to a surface of the injected silicone resin; and curing the injected silicone resin.

14 Claims, 7 Drawing Sheets

(52) U.S. Cl.
CPC .............. *H01L 2933/0058* (2013.01); *H01L 2933/0083* (2013.01); *H01L 2933/0091* (2013.01)

(56) References Cited

U.S. PATENT DOCUMENTS

| | | | |
|---|---|---|---|
| 2008/0069975 A1* | 3/2008 | Kato | C08G 73/02 428/1.31 |
| 2008/0123031 A1* | 5/2008 | Homma | G02B 5/0221 349/112 |
| 2009/0114938 A1* | 5/2009 | Hsu | H01L 33/501 257/98 |
| 2009/0146171 A1 | 6/2009 | Okubo | |
| 2010/0140638 A1* | 6/2010 | Kotani | B29C 45/0001 257/98 |
| 2010/0289048 A1* | 11/2010 | Kumura | H01L 33/56 257/98 |
| 2012/0161621 A1* | 6/2012 | Sato | H01L 33/54 313/512 |
| 2013/0083544 A1* | 4/2013 | Hosoda | G02B 5/0221 362/355 |
| 2013/0293097 A1* | 11/2013 | Bergenek | H05B 33/02 313/512 |
| 2014/0239332 A1* | 8/2014 | Iwakura | H01L 33/50 257/98 |
| 2015/0028373 A1* | 1/2015 | Abe | H01L 33/56 257/98 |
| 2016/0054486 A1 | 2/2016 | Isojima et al. | |
| 2016/0104827 A1* | 4/2016 | Hong | G02F 1/133617 349/71 |
| 2017/0123108 A1* | 5/2017 | Kobori | G02B 1/113 |
| 2017/0287867 A1* | 10/2017 | Liang | H01L 24/29 |

FOREIGN PATENT DOCUMENTS

| | | |
|---|---|---|
| JP | 2001-077433 | 3/2001 |
| JP | 2002-141557 | 5/2002 |
| JP | 2003-086846 | 3/2003 |
| JP | 2005-064111 | 3/2005 |
| JP | 2007-036030 | 2/2007 |
| JP | 2008-060068 | 3/2008 |
| JP | 2009-141051 | 6/2009 |
| JP | 2010-161420 | 7/2010 |
| JP | 2012-151466 | 8/2012 |
| JP | 2015-026698 | 2/2015 |
| JP | 2016-021435 | 2/2016 |
| JP | 2016-046262 | 4/2016 |
| JP | 2016-178344 | 10/2016 |
| WO | WO 2009/066398 | 5/2009 |
| WO | WO 2013/157310 | 10/2013 |

* cited by examiner

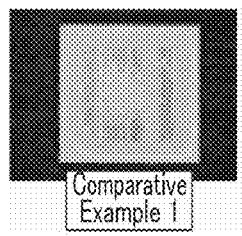 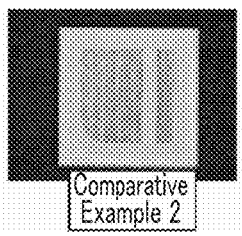 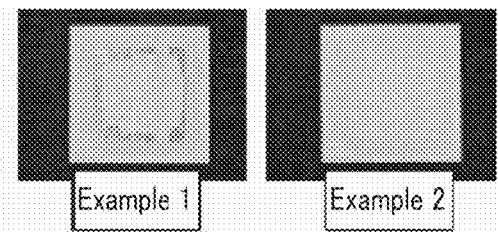
FIG. 7A  FIG. 7B  FIG. 7C  FIG. 7D

LIGHT-EMITTING DEVICE AND METHOD FOR MANUFACTURING SAME

CROSS-REFERENCE TO RELATED APPLICATIONS

The present application claims priority under 35 U.S.C. § 119 to Japanese Patent Application No. 2018-071079, filed on Apr. 2, 2018, which claims priority to Japanese Patent Application No. 2017-114961, filed on Jun. 12, 2017, all of which are hereby incorporated by reference in their entireties.

BACKGROUND

1. Technical Field

The present disclosure relates to a light-emitting device and a method for manufacturing the light-emitting device.

2. Description of Related Art

Conventionally, a light-emitting device includes a sealing member made of a resin material such as an epoxy resin or a silicone resin, in order to protect a light-emitting element mounted in the light-emitting device. Recently, silicone-based resins, which have good resistance to heat, have been mainly used for sealing members for protecting high-output and high-luminosity light-emitting elements mounted in a lighting device or a backlight of a liquid crystal panel for example.

The silicone-based resins have good resistance to heat, but they have adhesiveness (tackiness). For example, Japanese patent publication No. 2009-141051 proposes attaching microparticles of $SiO_2$ or the like on a surface of a silicone resin included in a light-emitting device after curing the silicone resin, in order to prevent delays in operations caused by the light-emitting device sticking to a tool or the like.

SUMMARY

A light-emitting device according to certain embodiments in the present disclosure includes: a light-emitting element; a light-transmissive member that covers the light-emitting element; and light-diffusing particles contained in the light-emitting element. The light-diffusing particles are hollow and have a particle size not smaller than 50 µm. The light-transmissive member has a surface having irregularities associated with the light-diffusing particles.

A method for manufacturing a light-emitting device according to certain embodiments in the present disclosure includes steps of: mounting a light-emitting element in a recess of a base member; injecting a silicone resin containing light-diffusing particles into the recess, the light-diffusing particles having a particle size not smaller than 50 µm; causing the light-diffusing particles to float up to a surface of the injected silicone resin; and curing the injected silicone resin.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

FIGS. 7A to 7D are photographs of light-emitting devices fabricated under conditions of Examples 1 and 2 according to the present disclosure and Comparative Examples 1 and 2 for comparison, where FIG. 7A is the photograph of the light-emitting device of Comparative Example 1; FIG. 7B, Comparative Example 2; FIG. 7C, Example 1; and FIG. 7D, Example 2.

DETAILED DESCRIPTION

Hereinafter, a description will be given of a light-emitting device and a method for manufacturing the light-emitting device according to an embodiment. Drawings referenced in the following description schematically shows embodiments. Thus, scales of members, distances between members, and positional relation between members or the like may have been presented in an exaggerated manner, and illustration of a portion of a member may have been omitted. Furthermore, the scale and distances between members may not match between a plan view and its corresponding cross-sectional view. In the following description, members that are the same or analogous will be given the same name or number in principle, and duplicative descriptions will be appropriately omitted. It should be noted that tackiness means adhesiveness.

Light-Emitting Device

Figure 1A:
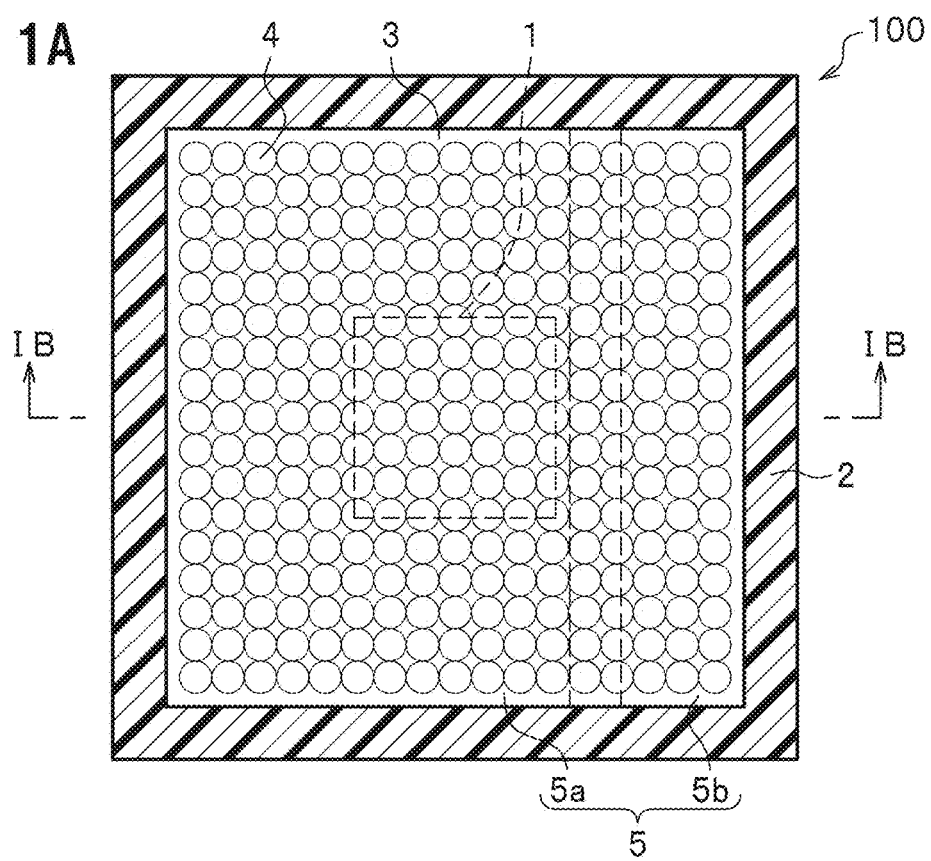
FIG. 1A is a plan view schematically illustrating the configuration of a light-emitting device according to a present embodiment.
Figure 1B:
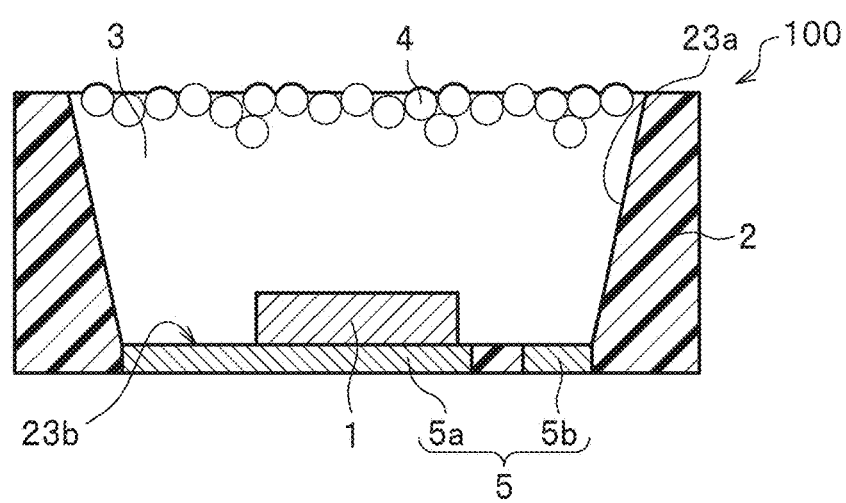
FIG. 1B is a schematic cross-sectional view of the light-emitting device according to the present embodiment, taken along line IB-IB in FIG. 1A.
Figure 1C:
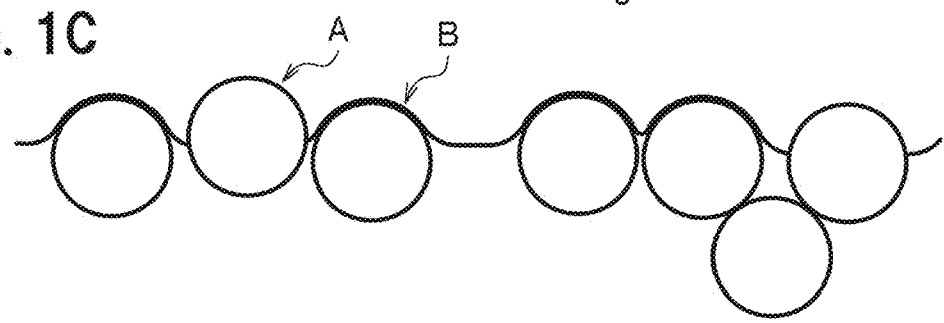
FIG. 1C is an enlarged view schematically illustrating a surface of a light-transmissive member of the light-emitting device according to the present embodiment shown in FIG. 1B.

First, a description will be given of a light-emitting device 100 according to the present embodiment with reference to FIGS. 1A, 1B, and 1C. FIG. 1A is a plan view schematically illustrating the configuration of the light-emitting device 100 according to the present embodiment; FIG. 1B is a cross-sectional view taken along line IB-IB in FIG. 1A; and FIG. 1C is an enlarged view schematically illustrating a surface of a light-transmissive member in FIG. 1B. Note that hatching patterns applied to the members shown in the cross-sectional view of FIG. 1B are correspondingly applied to the members shown in FIG. 1A.

The light-emitting device 100 includes a base member 2, a light-emitting element 1 disposed on the base member 2, and a light-transmissive member 3 containing a light-diffusing material 4 and covering the light-emitting element 1. The light-emitting element 1 is mounted on a base member 2. The light-diffusing material 4 is in the form of hollow particles having a particle size not smaller than 50 µm. The light-transmissive member 3 has a surface having irregularities associated with the light-diffusing material 4.

The light-emitting element 1 is mounted on the base member 2 by, for example, wire bonding with gold wires, or flip chip bonding with solder or silver paste. A single or a plurality of light-emitting elements 1 may be mounted on the base member 2. A known light-emitting element can be used as the light-emitting element 1. For example, a light-emitting diode or a laser diode may be preferably used. The base member 2 has a recess 23a and includes wiring 5 (wiring members 5a and 5b) exposed at a bottom surface 23b of the recess 23a. The light-emitting element 1 is electrically connected to the wiring members 5a and 5b and emits light having wavelengths in a wavelength range from ultraviolet to red. To emit blue or green light, a nitride-based semiconductor ($In_XAl_YGa_{1-X-Y}N$, $0≤X$, $0≤Y$, $X+Y≤1$) or GaP or the like may be used in the light-emitting element 1. To emit red light, in addition to a nitride-based semiconductor, GaAlAs or AlInGaP or the like may be used in the light-emitting element 1. The light-emitting element 1 may have a polygonal shape, such as square, rectangular, triangular, or hexagonal, or a round shape such as circular or oval, in plan view.

At least one light-emitting element 1 is mounted on the base member 2. The base member 2 allows the light-emitting device 100 to be electrically connected to external circuitry. The base member 2 includes: a support member having a flat-plate shape; and the wiring members 5a and 5b disposed on a surface of the support member or disposed on the surface of the support member and partially embedded therein. The base member 2 has a substantially square external shape in plan view, and has an inner wall defining an inner surface of the recess 23a and having a substantially square shape in plan view. The inner surface of the recess 23a is inclined such that the recess 23a has an upwardly increasing width. The inner surface efficiently guides light from the light-emitting element 1 upward, by reflecting the light in an upward direction, i.e., light-extracting direction, in accordance with the inclination of the inner surface. The base member 2 may include at a lower surface thereof a heat dissipation terminal electrically independent of the light-emitting element 1. Preferably, the heat dissipation terminal has an area greater than the sum of the areas of the upper surfaces of all the light-emitting element(s) 1 included in the light-emitting device 100, and is disposed so as to overlap a region directly below the light-emitting element(s) 1. With such an arrangement of the heat dissipation terminal, the light-emitting device 100 has good heat dissipation properties.

Preferably, the support member of the base member 2 is made of an insulative material, which is preferably less-transmissive to light emitted from the light-emitting element 1 and outside light or the like. Preferably, the support member of the base member 2 is made of a material having a predetermined strength. Specifically, examples of the material for the support member include: ceramic materials such as alumina, aluminum nitride, mullite and the like, and resin materials such as phenolic resins, epoxy resins, polyimide resins, bismaleimide-triazine resins (BT resins), polyphthalamides (PPA), polyamides (PA), and unsaturated polyesters.

The wiring members 5a and 5b correspond to positive and negative polarities. The wiring members 5a and 5b are supported by the support member of the base member 2, and are disposed such that the wiring members 5a and 5b are spaced apart from each other and the upper surfaces of the wiring members 5a and 5b are exposed at the bottom surface 23b of the recess 23a. The wiring members 5a and 5b are, for example, each constituted by a metal plate, which may have a uniform thickness or may have a partially thick or thin portion. Preferably, the wiring members 5a and 5b are made of a material having a large thermal conductivity, a material having a large mechanical strength, and/or a material easy to punch or etch. Examples of such a material include metals such as copper, aluminum, gold, silver, tungsten, iron, and nickel and alloys such as iron-nickel alloys, alloys of phosphor bronze and the like. The wiring members 5a and 5b can be formed by, for example, electroplating, electroless plating, vapor deposition, or sputtering.

The light-transmissive member 3 is disposed in the recess 23a to cover the light-emitting element 1. The light-transmissive member 3 contains the light-diffusing material 4 and has a surface with irregularities associated with the light-diffusing material 4. Comparing a surface with irregularities and a surface without irregularities, i.e., a flat surface, the former has a smaller contact area than the latter. Therefore, the surface of the light-transmissive member 3 is less tacky by having irregularities at the surface. Preferably, the irregularities are formed across over the entire area of the surface of the light-transmissive member 3, but may be formed in a partial region of the surface. Preferably, the irregularities formed on the surface of the light-transmissive member 3 have predetermined roughness. A rough surface with irregularities can be formed on the light-transmissive member 3 when a light-diffusing material 4 is added to the light-transmissive member 3. Preferably, the surface of the light-transmissive member 3 has a surface roughness of 0.3 µm to 0.6 µm, as a numerical measure of the irregularities of the surface. The light-transmissive member 3 having a surface roughness of that range reduces the tackiness and increases the luminous flux. Note that, herein, the surface of the light-transmissive member 3 basically refers to a surface opposite the bottom surface 23b of the recess 23a, i.e., an upper surface of the light-transmissive member 3, but may include a portion of a lateral surface of the light-transmissive member 3 which is contiguous to the upper surface.

As shown in FIG. 1C, the surface of the light-transmissive member 3 includes exposed portions A where some of the particles of the light-diffusing material 4 are exposed and covered portions B where the light-transmissive member 3 covers some of the particles of the light-diffusing material 4. The light-transmissive member 3 need not necessarily cover all the particles of the light-diffusing material 4. It suffices if the particles of the light-diffusing material 4 are distributed near the surface of the light-transmissive member 3 so that the surface of the light-transmissive member 3 has irregularities. The light-transmissive member 3 is softer than the light-diffusing material 4 and thus is resistant to impacts, and thus allows particles of the light-diffusing material 4 not to break even at the exposed portions A. At least a portion of each particle of the light-diffusing material 4 is embedded in the light-transmissive member 3 at both the exposed portions A and the covered portions B. For this reason, compared to the conventional light-emitting device in which microparticles are attached on a silicone resin after curing the silicone resin, detachment and breakage of the microparticles due to an impact are less likely to occur in the light-emitting device 100 according to the present embodiment.

Preferably, the light-transmissive member 3 is made of a material having good light-transmissivity, such as a thermosetting resin or a thermoplastic resin. Examples of the thermosetting resin include: silicone resins, modified silicone resins, silicone hybrid resins, epoxy resins, modified epoxy resins, urea resins, diallyl phthalate resins, phenolic resins, unsaturated polyester resins, and hybrid resins containing at least one type of the foregoing resins. In particular, silicone resins, modified silicone resins, and silicone hybrid resins are preferable due to their good resistance to heat and light. The light transmittance of the light-transmissive member 3 is preferably 50% or more, more preferably 70% or more, or still more preferably 85% or more.

The light-diffusing material 4 is in the form of hollow microparticles. In FIG. 1A, although the microparticles of the light-diffusing material 4 are illustrated as being distributed uniformly across the surface of the light-transmissive member 3, actual microparticles of the light-diffusing material 4 are distributed in a random fashion such that distances between microparticles are not uniform and the microparticles are randomly exposed. The microparticles of the light-diffusing material 4 are distributed such that some of the microparticles are partially covered by and partially exposed from the light-transmissive member 3, and others of the microparticles are completely covered by the light-transmissive member 3. The particle size of the light-diffusing material 4 is preferably not smaller than 50 and more preferably 65 μm to 70 μm. If the light-diffusing material 4 has a small particle size, the light-diffusing material 4 is likely not to float up in the light-transmissive member 3 and is likely to increase the tackiness of the light-transmissive member 3. If the particles of the light-diffusing material 4 has a larger particle size and a smaller hollow volume, the particles of the light-diffusing material 4 is likely to settle down in the light-transmissive member 3. Accordingly, configuring the particles of the light-diffusing material 4 to have a particle size within the above-described range facilitates the floating of the light-diffusing material 4 up to the surface of the light-transmissive member 3. According to the above selection of the particle size, preferable irregularities may be formed on the surface of the light-transmissive member 3 to reduce the tackiness of the surface of the light-transmissive member 3. Reduction of the tackiness of the light-transmissive member 3 may prevent delays in operations caused by, for example, a light-emitting device sticking to a tool or the like, light-emitting devices sticking to one another while being transported, and the like.

The bulk density (or specific gravity) of the light-diffusing material 4 with respect to the light-transmissive member 3 is preferably 0.1 g/cm$^3$ to 0.7 g/cm$^3$, and more preferably 0.1 g/cm$^3$ to 0.2 g/cm$^3$. The smaller the bulk density of the light-diffusing material 4 with respect to the light-transmissive member 3, the more likely the light-diffusing material 4 floats up. If the light-diffusing material 4 has too small bulk density, the light-diffusing material 4 may float up while being dispersed into the light-transmissive member 3 or may be unevenly distributed in a dispenser. These sorts of problems may impair workability. Accordingly, configuring the light-diffusing material 4 to have a bulk density within the above-described range allows the light-diffusing material 4 to float up to the surface of the light-transmissive member 3 after having been dispersed in the light-transmissive member 3, thus facilitating forming irregularities on the surface of the light-transmissive member 3.

Preferably, the particles of the light-diffusing material 4 have a spherical shape. The particles of the light-diffusing material 4 having a spherical shape facilitate forming uniformly distributed irregularities on the surface of the light-transmissive member 3. The light-diffusing material 4 may be hollow white microparticles or transparent hollow microparticles that are seen as white due to diffusion caused by a difference in the refractive indices between the surrounding material and the light-diffusing material 4. The light-diffusing material 4 causes light emitted by the light-emitting element 1 to diffuse and thereby improves the light extraction efficiency of the light-emitting device 100. Therefore, the light-diffusing material 4 is preferably made of a material having a refractive index largely different from that of the light-transmissive member 3. The material for the light-diffusing material 4 may, for example, be fine powder (hollow filler) containing hollow silica particles, hollow glass particles, hollow ceramic particles, fly ash particles, shirasu balloons, hollow polymer particles, porous silica particles, porous polymer particles, or the like. The light-diffusing material 4 may be fine powder (hollow filler) made of a mixture of these materials. For example, use of a mixture of a light-transmissive member 3 made of a silicone resin having a refractive index of 1.50 to 1.55 and a light-diffusing material 4 made of hollow silica particles having a refractive index of 1.35 to 1.45 may increase the efficiency of extracting light from the light-emitting element 1 and the like to the outside.

The amount of the light-diffusing material 4 added to the light-transmissive member 3 is preferably 0.2 parts to 3 parts, or more preferably 0.2 parts to 1.5 parts, with respect to the amount of the light-transmissive member 3. A more additive amount of light-diffusing material 4 can decrease the tackiness of the light-transmissive member 3. An excessive amount of light-diffusing material 4, however, may cause problems such as: a decrease in the luminous intensity of the light-emitting device due to a decrease in the transmissivity; and a decrease in the workability due to an increase in the tackiness of the light-transmissive member 3. The above-described amount of light-diffusing material 4 added to the light-transmissive member 3 can create moderate irregularities on the surface of the light-transmissive member 3 and thereby decrease the tackiness thereof without causing a decrease in the luminous intensity of the light-emitting device. Note the unit "part" of the additive amount of the light-diffusing material 4 corresponds to the weight of the light-diffusing material 4 with respect to a 100 g of the light-transmissive member 3. For example, 50 parts of additive amount of the light-diffusing material 4 means that a 50 g of the light-diffusing material 4 is added to a 100 g of the light-transmissive member 3.

In the light-emitting device 100 according to the present embodiment, the light-diffusing material 4, which is originally added to the light-transmissive member 3 for the purpose of controlling light distribution, is utilized to create irregularities on the surface of the light-transmissive member 3 by appropriately selecting the particle size, bulk density, and amount of the light-diffusing material 4 added to the light-transmissive member 3. In this way, the tackiness of the light-transmissive member 3 of the light-emitting device 100 is reduced. In addition, in the light-emitting device 100, the surface of the light-transmissive member 3 on which irregularities are formed provides a light-emitting plane with uniform color due to effective diffusion by the irregularities.

Light-Emitting Device Manufacturing Method

Next, a description will be given of a method for manufacturing the light-emitting device according to the present embodiment with reference to FIGS. 2 and 3A to 3E. Note that the order of some manufacturing steps is not limited and may be changed.

Figure 2:
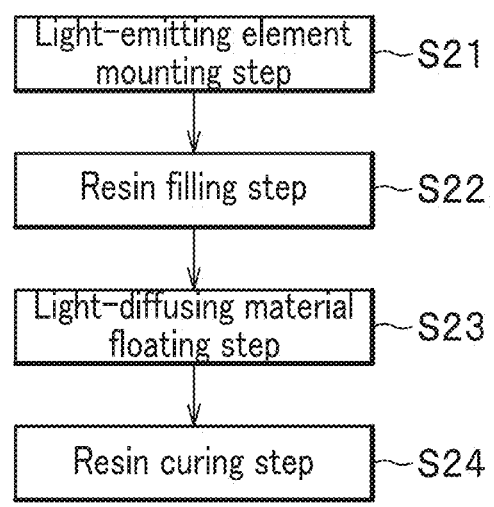
FIG. 2 is a flowchart of a method for manufacturing a light-emitting device according to the present embodiment.

FIG. 2 is a flowchart of the method for manufacturing a light-emitting device according to the present embodiment. The method for manufacturing a light-emitting device according to the present embodiment includes a light-emitting element mounting step S21, a resin filling step S22, a light diffusing material floating step S23, and a resin curing step S24.

Figure 3A:
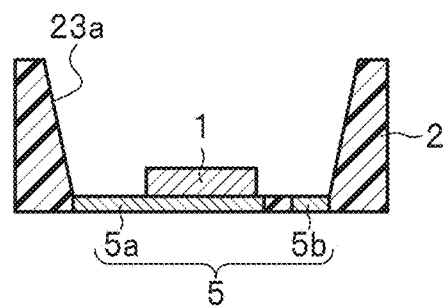
FIG. 3A is a cross-sectional view illustrating a light-emitting element mounting step of the method for manufacturing a light-emitting device according to the present embodiment.
Figure 3B:
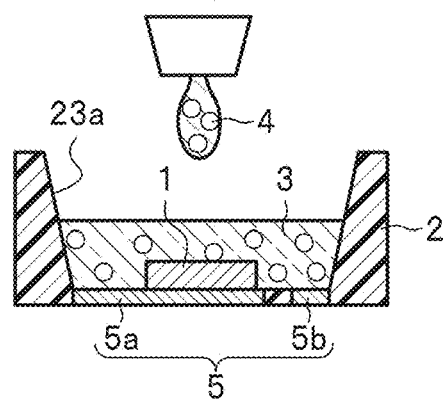
FIG. 3B is a cross-sectional view illustrating a resin filling step of the method for manufacturing a light-emitting device according to the present embodiment.
Figure 3C:
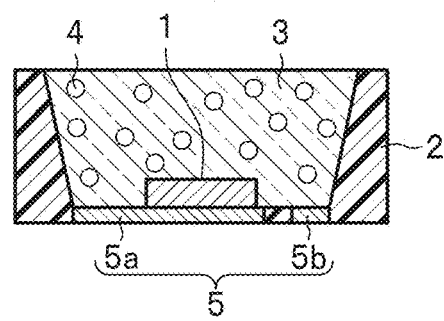
FIG. 3C is another cross-sectional view illustrating the resin filling step of the method for manufacturing a light-emitting device according to the present embodiment.
Figure 3D:
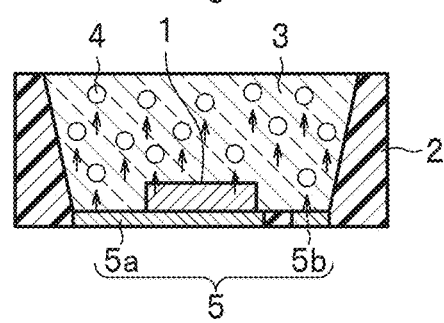
FIG. 3D is a cross-sectional view illustrating a light diffusing material floating step of the method for manufacturing a light-emitting device according to the present embodiment.
Figure 3E:
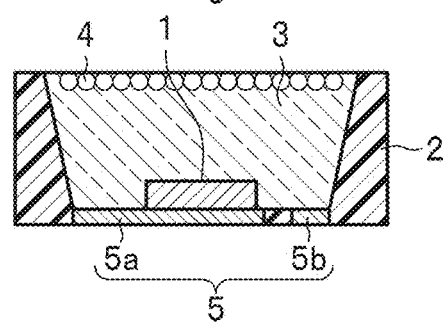
FIG. 3E is a cross-sectional view illustrating a resin curing step of the method for manufacturing a light-emitting device according to the present embodiment.

FIG. 3A is a cross-sectional view illustrating the light-emitting element mounting step S21 in the method for manufacturing a light-emitting device according to the present embodiment. FIGS. 3B and 3C are each a cross-sectional view illustrating the resin filling step S22 in the method for manufacturing a light-emitting device according to the present embodiment. FIG. 3D is a cross-sectional view illustrating the light diffusing material floating step S23 in the method for manufacturing a light-emitting device according to the present embodiment. FIG. 3E is a cross-sectional view illustrating resin curing step S24 in the method for manufacturing a light-emitting device according to the present embodiment.

As illustrated in FIG. 3A, the light-emitting element mounting step S21 mounts a light-emitting element 1 in a recess 23a of a base member 2. In the light-emitting element mounting step S21, the light-emitting element 1 is mounted on the base member 2 to be electrically connected to the wiring members 5a and 5b via wire or bumps.

As shown in FIG. 3B, the resin filling step S22 fills a silicone resin that becomes a light-transmissive member 3 in the recess 23a of the base member 2. At the time of carrying out the resin filling step S22, a light-diffusing material 4 has been added to the silicone resin in advance and the light-diffusing material 4 has been evenly dispersed in the silicone resin. The silicone resin is dropped into the recess 23a of the base member 2 by, for example, potting using a dispenser.

As illustrated in FIG. 3C, the resin filling step S22 fills the silicone resin, to which the light-diffusing material 4 has been added, up to an uppermost surface of the recess 23a. The use of the light-diffusing material 4 having predetermined particle size, bulk density, and additive amount allows the light-diffusing material 4 to be evenly dispersed in the silicone resin and to float up to near the surface of the silicone resin in the following light diffusing material floating step S23, while preventing an increase in the tackiness of the silicone resin.

As shown in FIG. 3D, the light diffusing material floating step S23 makes the light-diffusing material 4 float up to the surface of the silicone resin. In the light diffusing material floating step S23, the silicone resin in which the light-diffusing material 4 is evenly dispersed is left for 12 hours at a temperature of 40° C. As the light-diffusing material 4 is lighter than the silicone resin and the particle size and the like of the light-diffusing material 4 have been selected as described above, the light-diffusing material 4 gradually floats up in the uncured silicone resin (see the arrows in FIG. 3D) and finally reaches near the surface of the silicone resin as time elapses. In this way, irregularities associated with the light-diffusing material 4 are formed on the surface of the silicone resin.

As illustrated in FIG. 3E, the resin curing step S24 cures the silicone resin. In the resin curing step S24, the silicone resin is heated for four hours at a temperature of 150° C. When the silicone resin is cured by being heated, the light-diffusing material 4 having floated up near the surface of the silicone resin is fixed near the surface of the silicone resin, forming irregularities on the surface of the silicone resin. To cause the irregularities on the surface of the silicone resin to reduce tackiness, the heating temperature is preferably adjusted to near 150° C.

Carrying out the above-described steps produces the light-emitting device 100.

It should be noted that, the above description is given as to one light-emitting device 100. In practice, a plurality of the light-emitting devices 100 are formed on a contiguous series of the base members 2 and then they are singulated into individual light-emitting devices 100.

In the method for manufacturing a light-emitting device according to the present embodiment, the light-diffusing material 4 is made to float up to near the surface of the silicone resin to form irregularities associated with the light-diffusing material 4, by selecting the particle size, bulk density, and additive amount of the light-diffusing material 4. In this way, the method produces a light-emitting device with silicone resin having reduced tackiness. It should be noted that, according to the method, as at least a portion of each particle of the light-diffusing material 4 is embedded in the silicone resin, the light-diffusing material 4 is unlikely to detach from the light-emitting device due to an impact or the like.

The method for manufacturing a light-emitting device according to the present embodiment offers simplified, reduced number of steps compared to a conventional method that attempts to reduce tackiness by, for example, hard coating a low-viscosity, elastic material or spraying a coating material for demolding on a surface of cured resin. In addition, the method for manufacturing a light-emitting device according to the present embodiment forms irregularities on a surface of a silicone resin into which the light-diffusing material has been integrated. This allows reducing the tackiness of the silicone resin while minimizing occurrences of problems such as a low light extraction efficiency due to an interface formed between a coating layer and a resin layer.

Figure 4A:
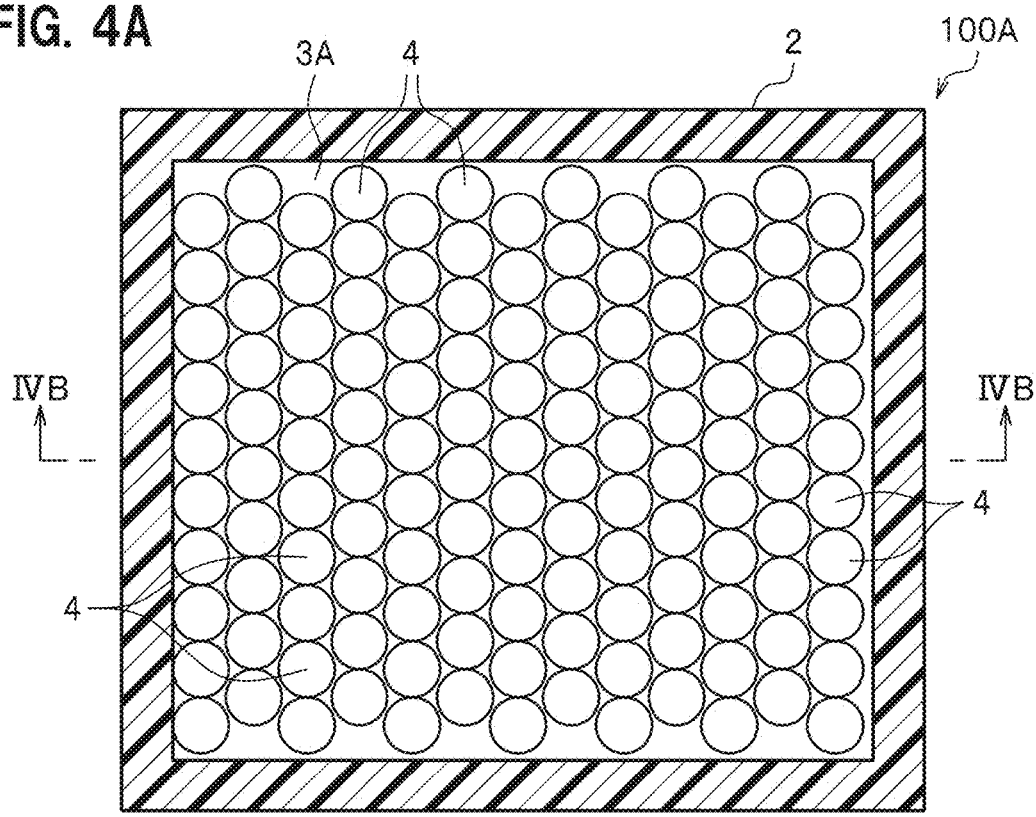
FIG. 4A is a plan view schematically illustrating the configuration of another light-emitting device according to the present embodiment.
Figure 4B:
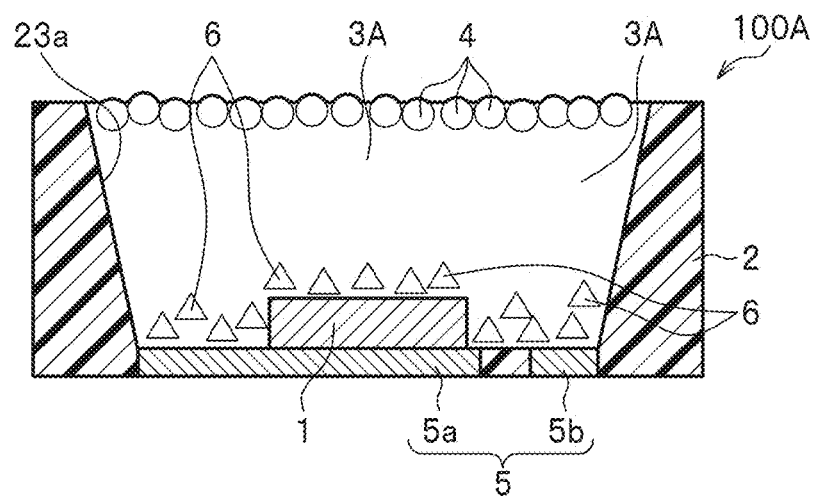
FIG. 4B is a cross-sectional view of the another light-emitting device according to the present embodiment, taken along line IVB-IVB in FIG. 4A.

The light-transmissive member 3 of a light-emitting device according to the present embodiment may contain a phosphor in addition to the light-diffusing material 4. Hereinafter, a description will be given of a light-emitting device 100A, which is another light-emitting device according to the present embodiment, with reference to FIGS. 4A and 4B. Of the constituent elements of the light-emitting device 100A, those already described are given the same reference signs and duplicate descriptions thereof are omitted as appropriate. FIG. 4A is a plan view schematically illustrating the configuration of the light-emitting device 100A. FIG. 4B is a cross-sectional view of the light-emitting device 100A, taken along line IVB-IVB in FIG. 4A. The light-emitting device 100A includes the light-emitting element 1 disposed on the base member 2, and a light-transmissive member 3A containing the light-diffusing material 4 and a phosphor (wavelength conversion substance) 6 and covering the light-emitting element 1. In the light-emitting device 100A, the particles of the light-diffusing material 4 may be aligned in the light-transmissive member 3A, such that particles in a line are each located adjacent to corresponding two of particles of an adjacent line (see FIG. 4A), or such that the particles in a line are each located adjacent to corresponding one of particles of an adjacent line (see FIG. 1A), or may be aligned in a manner in which the above two are mixed.

Phosphor

The phosphor 6 only has to absorb light from the light-emitting element 1 and thereby emit light having a different wavelength. Examples of the phosphor 6 include: a cerium-activated yttrium-aluminum-garnet-based fluorescent material (YAG:Ce); a cerium-activated lutetium-aluminum-garnet-based fluorescent material (LAG:Ce); an europium- and/or chromium-activated nitrogen-containing calcium-aluminosilicate-based fluorescent material ($CaO—Al_2O_3—SiO_2$:Eu,Cr); an europium-activated silicate-based fluorescent material ($(Sr,Ba)2SiO_4$:Eu); a nitride-based fluorescent material such as a β-sialon fluorescent material, a CASN-based fluorescent material ($CaAlSiN_3$:Eu), a SCASN-based fluorescent material ($(Sr,Ca)AlSiN_3$:Eu); a KSF-based fluorescent material ($K_2SiF_6$:Mn); and a sulfide-based fluorescent material. With the phosphor 6, the light-emitting device 100A can emit a mixture of first light and second light both having a visible wavelength, e.g., white light, or emit second light having a visible wavelength produced by excitation of the phosphor 6 with first light having an ultraviolet wavelength. The phosphor 6 may be a combination of a plurality types of phosphors. The color rendering properties and/or the color reproducibility can be controlled by combining phosphors with a ratio depending on the desired color tone. Preferably, the phosphor 6 has a higher particle number density in a portion of the light-transmissive member 3A near the light-emitting element 1 than in a portion of the light-transmissive member 3A near the upper surface thereof. By increasing the particle number density of the phosphor 6 in a portion of the light-transmissive member 3A near the light-emitting element 1, the wavelength conversion efficiency is increased and thus the amount of the phosphor 6 necessary for achieving desired chromaticity can be reduced.

The phosphor 6 and the light-transmissive member 3A preferably have a specific gravity difference of 0.5 $g/cm^3$ to 10 $g/cm^3$, or more preferably 1 $g/cm^3$ to 6 $g/cm^3$. The phosphor 6 is dispersed in the light-transmissive member 3A. Then, the light-transmissive member 3A is filled into the recess 23a of the base member 2. The phosphor 6 then settles down in the light-transmissive member 3A. By selecting the specific gravity of the phosphor 6 within the above-described range, the phosphor 6 is well dispersed and settles down in a short time. This increases the particle number density of the phosphor 6 in a portion of the light-transmissive member 3A near the light-emitting element 1 and thus increases the wavelength conversion efficiency.

Figure 5A:
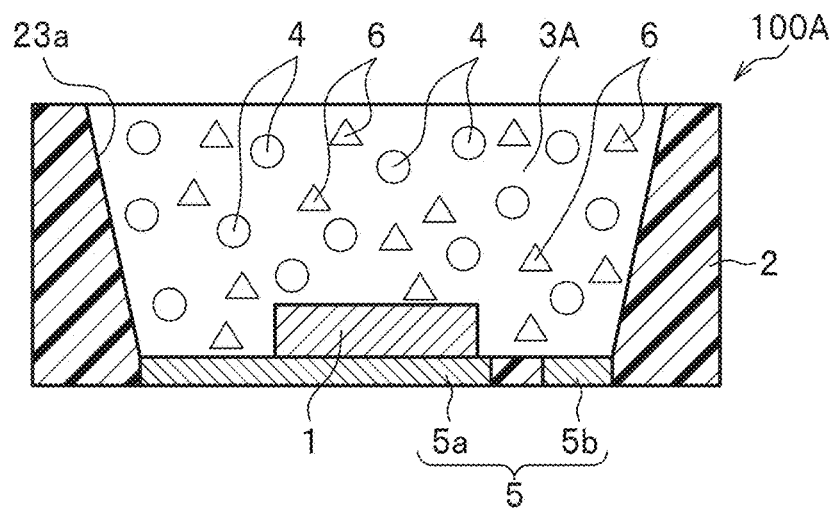
FIG. 5A is a cross-sectional view schematically illustrating a state of a light-transmissive member containing a phosphor and a light-diffusing material in a method for manufacturing the another light-emitting device according to the present embodiment.
Figure 5B:
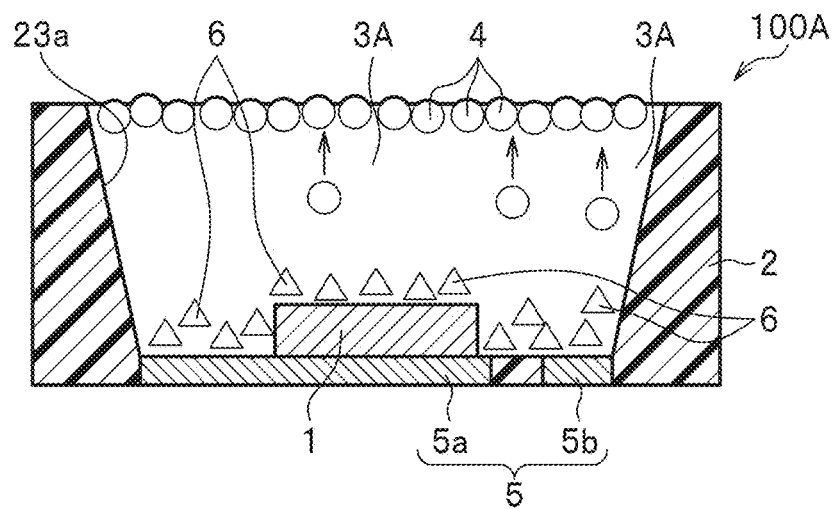
FIG. 5B is a cross-sectional view schematically illustrating a state of the light-transmissive member in which the phosphor has settled down and the light-diffusing material has floated up in the method for manufacturing the another light-emitting device according to the present embodiment.

A description will be given of relationship between the settling down of the phosphor 6 and the floating up of the light-diffusing material (hollow filler) 4, with reference to FIGS. 5A and 5B. FIG. 5A is a cross-sectional view schematically illustrating a state of the light-transmissive member 3A containing the phosphor 6 and the light-diffusing material 4 in the method for manufacturing the another light-emitting device according to the present embodiment. FIG. 5B is a cross-sectional view schematically illustrating a state of the light-transmissive member 3A in which the phosphor 6 has settled down and the light-diffusing material 4 has floated up in the method for manufacturing the another light-emitting device according to the present embodiment. The phosphor 6 and the light-diffusing material 4 are added to a silicone resin to be contained therein, and then the silicone resin is filled in the recess 23a as the light-transmissive member 3A. Then, leaving the silicone resin for a predetermined period of time causes the light-diffusing material 4 to float up due to the difference in the specific gravity between the light-diffusing material 4 and the silicone resin and causes the phosphor 6 to settle down due to the difference in the specific gravity between the phosphor 6 and the silicone resin. As a result, in a portion of the silicone resin near the upper surface (emission plane) of the light-transmissive member, the particle number density of the light-diffusing material 4 becomes higher than that of the phosphor 6. Also as a result, in a portion of the silicone resin near the light-emitting element 1, the particle number density of the phosphor 6 becomes higher than that of the light-diffusing material 4. It should be noted that the steps illustrated in FIGS. 5A and 5B are the same as the steps of the light-emitting device manufacturing method described with reference to FIGS. 3B and 3E, except that the silicone resin (light-transmissive member 3A) contains the light-diffusing material 4 and the phosphor 6. The steps other than those illustrated in FIGS. 5A and 5B are the same as those already described.

The light-transmissive member 3A has a specific gravity of 1.1 $g/cm^3$ to 1.5 $g/cm^3$. The phosphor 6 and the light-transmissive member 3A preferably have a specific gravity difference of 0.5 $g/cm^3$ to 10 $g/cm^3$, or more preferably 1 $g/cm^3$ to 6 $g/cm^3$. In addition, the light-diffusing material 4 has a bulk density (or specific gravity) of 0.1 $g/cm^3$ to 0.7 $g/cm^3$, or more preferably 0.1 $g/cm^3$ to 0.2 $g/cm^3$, with respect to the light-transmissive member 3A. Preferably, the particle number density of the light-diffusing material 4 on the surface of the light-transmissive member 3A is higher than the particle number density of the phosphor 6 on the surface of the light-transmissive member 3A.

Hereinafter, a description will be given of examples of the light-emitting device according to the present disclosure. It should be noted that the light-emitting device according to the present disclosure is not limited to the examples described below.

Examples 1 and 2 and Comparative Examples 1 and 2

Light-emitting devices 100 were fabricated in accordance with the method for manufacturing a light-emitting device according to the above-described embodiment. The light-emitting device 100 of Example 1 was fabricated such that the amount of the light-diffusing material 4 added to the light-transmissive member 3 was 0.2 parts with respect to the amount of the light-transmissive member 3. The light-emitting device 100 of Example 2 was fabricated such that the amount of the light-diffusing material 4 added to the light-transmissive member 3 was 1.5 parts with respect to the amount of the light-transmissive member 3.

Details of Examples 1 and 2 were as follows:
Light-Emitting Element 1
Number of pieces: 1
Type: Emits blue light having an emission peak wavelength of 455 nm
External dimensions in plan view: 0.65 mm square
Height: 200 μm
Base Member 2
Material: Epoxy resin; product number: LUEL-300ME
Outer dimensions in plan view: 3.0 mm square
Inner dimensions in plan view: 2.6 mm square
Height: 0.7 mm
Shape: Substantially cuboid
Light-Transmissive Member 3
Material: Methyl silicone resin (manufactured by DOW CORNING TORAY™; product name: OE-6351)
External dimensions in plan view: 2.6 mm square
Thickness: 41 μm
Curing condition: 12 hrs at 40° C.+4 hrs at 150° C.
Light-Diffusing Material 4
Type: Hollow filler
Average particle size: 65 μm
Specific gravity: 0.13
Shape: Sphere We fabricated light-emitting devices of Comparative Examples 1 and 2 for comparison with the light-emitting devices of Examples 1 and 2. The light-emitting device of Comparative Example 1 was fabricated such that the amount of the light-diffusing material added to the light-transmissive member was 0.1 parts with respect to the amount of the light-transmissive member. The light-emitting device of Comparative Example 2 was fabricated such that no light-diffusing material was added to the light-transmissive member. The light-emitting devices of Comparative Examples 1 and 2 were fabricated in the same manner as Example 1, except the amount of the light-diffusing material added to the light-transmissive member. Other details of constituent elements of the Comparative Examples 1 and 2 are the same as those described above for Examples 1 and 2. Incidentally, as the light-emitting device of Comparative Example 2 has the light-transmissive member to which no light-diffusing material has been added, the particle size of Comparative Example 2 indicated in the later-presented Table 1 is left blank.

The following experiments were conducted on the light-emitting devices of Examples 1 and 2 and Comparative Examples 1 and 2.

Sticking Test

For each of the light-emitting devices of Examples 1 and 2 and Comparative Examples 1 and 2, the following steps were performed in order: putting a plurality of the light-emitting devices in an IC pack; putting the IC pack in a cylindrical vessel to be rotated on a ball mill; eliminating static electricity of the plurality of the light emitting elements; rotating the cylindrical vessel on the ball mil, the cylindrical vessel storing the IC pack containing the plurality of the light-emitting devices whose static electricity has been removed; taking out the IC pack from the cylindrical vessel; taking out the plurality of the light-emitting devices from the IC pack; and counting the number of light-emitting devices sticking to each other.

Static electricity elimination: Two minutes
Rotation by ball mill: Five minutes
Measurement of Emission Flux The light-emitting devices of Examples 1 and 2 and Comparative Examples 1 and 2 were measured as to their emission flux, using a spectrometer.

Rolling Ball Tack Test

A ball was rolled on an inclined resin plate, and a distance (stopping distance) from the location where the ball started rolling to the location where the ball stopped was measured. The stopping distance is small for a resin plate with great tackiness, and is large for a resin plate with small tackiness. Thus, measured stopping distances were used to determine the tackiness of resin plates. The resin plates were respectively formed in the same manner as the materials of the light-transmissive members of Examples 1 and 2 and Comparative Examples 1 and 2.

Material of ball: Polyamide 66 (PA66)
Inclination angle of resin plates: 5°
Run-up distance: 2 cm
Size of resin plate: 140 mm×70 mm×3 mm Table 1 indicates results of evaluations. Table 1 shows the additive amount [phr (part)], particle size [μm], specific gravity [g/cm$^3$], occurrence rate of sticking [%], emission flux [W] of each of the light-emitting devices of Examples 1 and 2 and Comparative Examples 1 and 2. The occurrence rate of sticking is a number obtained by: dividing the number of light-emitting devices sticking to another light emitting device when they are taken out from the IC pack by the total number of the light-emitting devices; and multiplying the result of the division by 100. Note that the number of light-emitting devices sticking to another light emitting device indicates the number of light-emitting devices that are sticking to another light-emitting device immediately after rotating the cylindrical vessel by the ball mill, and includes the number of light-emitting devices that have separated as time elapses. The emission flux is a value of emission energy passing through a predetermined plane per unit time.

TABLE 1

| Examples/Comparative Examples | Additive amount [phr] | Particle size [μm] | Specific gravity [g/cm$^3$] | Occurrence rate of sticking [%] | Emission flux [W] |
|---|---|---|---|---|---|
| Example 1 | 0.2 | 65 | 0.13 | 80% | 101.5 |
| Example 2 | 1.5 | 65 | 0.13 | 0% | 98.9 |
| Comparative Example 1 | 0.1 | 65 | 0.13 | 90% | 101.3 |
| Comparative Example 2 | 0 | — | 0.13 | 98% | 100 |

The result shows that the occurrence rate of sticking was 80% or less in Examples 1 and 2, and 90% or more in Comparative Examples 1 and 2. In particular, the occurrence rate of sticking was 0% in Example 2. Although there was no significant difference in the emission flux between Examples 1 and 2 and Comparative Examples 1 and 2, the emission flux of Example 1 was greater than that of Comparative Example 2.

These result shows that it is possible to reduce the tackiness of the light-emitting device by adding 0.2 parts or more of light-diffusing material having a particle size of 50 μm or more to the silicone resin of the light-emitting device. It also shows that adding 1.5 parts of light-diffusing material to the silicone resin can completely eliminate the tackiness of the light-emitting device. It is preferable that the bulk density of the light-diffusing material with respect to the silicone resin be a value in the range from 0.1 g/cm$^3$ to 0.2 g/cm$^3$. It should be noted that the irregularities of the surface of the light-transmissive member 3 had a surface roughness Ra of 0.37 μm when using the light-diffusing material 4 having a particle size effective to reduction of the tackiness.

In view of this, taking into consideration the effectiveness for reduction of the tackiness and the buoyancy of the light-diffusing material 4, the surface roughness of the light-transmissive member 3 is preferably 0.3 μm to 0.6 μm.

It further shows that the light-emitting device in which 0.2 parts of light-diffusing material is added to the silicone resin has an improved light extraction efficiency compared to the light-emitting device in which no light-diffusing material has been added to the silicone resin. It also shows that the light extraction efficiency of a light-emitting device can be substantially maintained even when up to 1.5 parts of light-diffusing material has been added to the silicone resin. It also shows that, the amount of the light-diffusing material added to the silicone resin is preferably from 0.2 parts to 1.5 parts with respect to the amount of the silicone resin.

Figure 6:
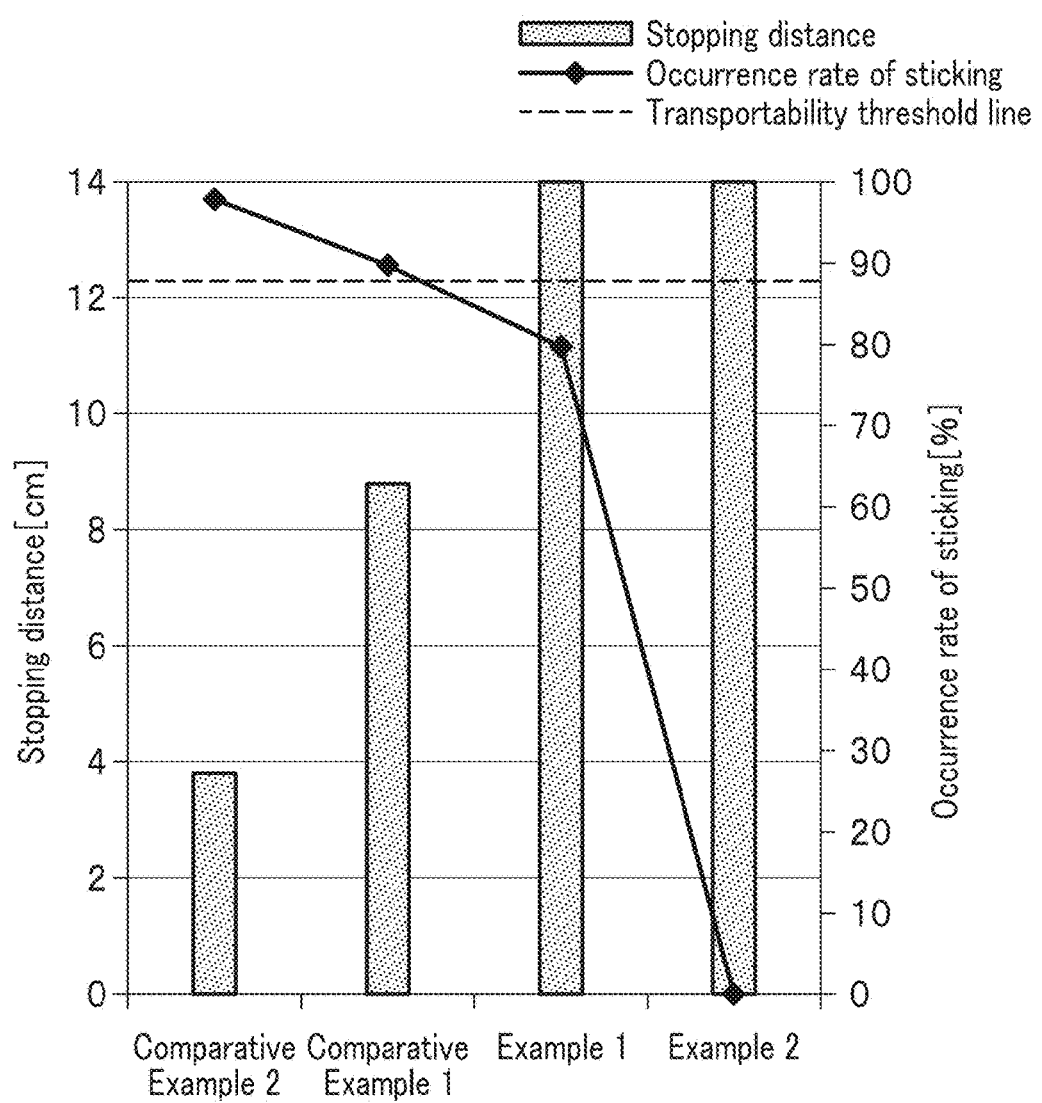
FIG. 6 is a diagram showing results of a sticking test and a rolling ball tack test.

FIG. 6 is a graph showing the result of measuring the occurrence rate of sticking [%] and the stopping distance [cm] of the light-emitting devices of Examples 1 and 2 and Comparative Examples 1 and 2. The right vertical axis in FIG. 6 represents the occurrence rate of sticking [%]. The left vertical axis in FIG. 6 represents the stopping distance [cm].

In FIG. 6, the transportability threshold line represents a state in which the tackiness of the silicone resin has been so reduced that no delay or the like would occur in transportation of the light-emitting device samples due to the tackiness. Specifically, an occurrence rate of sticking [%] smaller than the value (89%) of the transportability threshold line means good transportability, and a stopping distance [cm] greater than the value (12 cm) of the transportability threshold line means good transportability.

According to the measurement result, the stopping distance was 14 cm or larger in Examples 1 and 2; 8.8 cm in Comparative Example 1; and 3.8 cm in Comparative Example 2. That is, the stopping distances of Examples 1 and 2 were greater than the value of transportability threshold line, whereas the stopping distances of Comparative Examples 1 and 2 were smaller than the value of the transportability threshold line. The occurrence rate of sticking of Example 1 was 80% in Example 1; 0% in Example 2; 90% in Comparative Example 1; and 98% Comparative Example 2. Thus, the occurrence rates of sticking of Examples 1 and 2 were smaller than the value of transportability threshold line, whereas the occurrence rates of sticking of Comparative Examples 1 and 2 were greater than the value of transportability line.

This result shows that it is possible to reduce the tackiness of the light-emitting device by adding 0.2 parts or more of light-diffusing material having a particle size of 50 μm to the silicone resin of the light-emitting device, and suggests that delays or the like of operations due to the tackiness of the silicone resin would not occur. It also shows that the more the additive amount of the light-diffusing material, the more the tackiness of the light-emitting device can be reduced. It further shows that the particle size of the light-diffusing material is preferably from 65 μm to 70 μm. FIGS. 7A to 7D are, respectively, photographs of top view of the light-emitting devices fabricated under conditions of Comparative Examples 1 and 2 and Examples 1 and 2 indicated in Table 1. As shown in FIGS. 7C and 7D, the irregularities formed on a surface of each of the light-emitting devices of Examples 1 and 2 according to the present disclosure extend over a large area of the surface. This leads to low tackiness and thus provides good workability. In contrast, observing the surfaces of the light-emitting devices of Comparative Examples 1 and 2 shown in FIGS. 7A and 7B, the irregularities formed on the surface of each of the light-emitting devices of Comparative Examples 1 and 2 extend only over a limited area. Thus, the light-emitting devices of Comparative Examples 1 and 2 cannot achieve such low tackiness as that achieved by light-emitting devices of Examples 1 and 2.

Example 3 and Comparative Example 3

As Example 3, we fabricated a light-emitting device in accordance with the method for manufacturing the another light-emitting device according to the present embodiment. In the light-emitting device of Example 3, 3 parts of light-diffusing material was added to a 100 parts of the light-transmissive member, and phosphor was further added to the light-transmissive member so as to obtain light having a color temperature of 5000K, which corresponds to chromaticity coordinates of (0.347, 0.371). The light-emitting device of Example 3 was fabricated in the same manner as Example 1 except the additive amount of the light-diffusing material and the addition of the phosphor to the light-transmissive member.

In the light-emitting device of Comparative Example 3, the light-transmissive member was not added with any light-diffusing material but added with a phosphor so as to obtain light having a color temperature of 5000K, which corresponds to chromaticity coordinates of (0.347, 0.371). The light-emitting device of Comparative Example 3 was fabricated in the same manner as Example 1 except the addition of the phosphor to the light-transmissive member.

The following experiment was conducted on the light-emitting devices of Example 3 and Comparative Example 3.

The non-self-luminous colors of the light-emitting devices of Example 3 and Comparative Example 3 were measured using a high speed colorimetric spectrophotometer (manufactured by MURAKAMI COLOR RESEARCH LABORATORY CO., Ltd; product name: CMS-35PS).

The chromaticity coordinates of the non-self-luminous color of the light-emitting device of Example 3 was (0.356, 0.361), whereas the chromaticity coordinates of the non-self-luminous color of the light-emitting device of Comparative Example 3 was (0.456, 0.489). That is, as to the light-emitting device of Comparative Example 3, the emission color was white, whereas the non-self-luminous color was yellow. The yellow color of the latter is the color of the phosphor itself. In contrast, both the emission color and the non-self-luminous color of the light-emitting device of Example 3 were white.

That is, comparing the light-emitting device in which the light-diffusing material has been added to the light-transmissive member and the light-emitting device in which the light-diffusing material has not been added to the light-transmissive member, they differ from each other in the color of their appearances despite of their same emission color. This is because of the diffusion of light by the irregularities associated with the light-diffusing material formed on the surface of the light-transmissive member and having a particle size not smaller than 50 μm.

It should be noted that, in the light-emitting device in which the light-diffusing material has not been added to the light-transmissive member, portions of the light-transmissive member where phosphor is present are seen as having a noticeable dark color. In contrast, in the light-emitting device in which the light-diffusing material has been added to the light-transmissive member, the emission plane was whitened such that portions of the light-transmissive member where phosphor is present are not noticeable. This means the irregularities formed on the surface of the light-transmissive member whitens the appearance of the light-emitting device, so that the emission plane presents a uniform color.

The embodiments for carrying out the invention have been specifically described. It should be noted, however, that the spirit of the present invention is not limited thereto and should be construed broadly based on the scope of claims. It goes without saying that the spirit of the present invention also includes variations and modifications based on the foregoing descriptions. It also should be noted that the light-diffusing material 4 described in the embodiments generally takes the form of hollow filler, micropowder, or microparticles.

The light-emitting devices of the embodiments according to the present disclosure are applicable to lighting devices, backlights of liquid crystal panels and the like.

The invention claimed is:

1. A light-emitting device comprising:
   a light-emitting element;
   a light-transmissive member that covers the light-emitting element, the light-transmissive member made of a silicone resin; and
   light-diffusing particles contained in the light-transmissive member,
   wherein the light-diffusing particles are hollow and have a particle size of 65 μm to 70 μm, and
   the light-transmissive member has a surface having irregularities associated with the light-diffusing particles.

2. The light-emitting device of claim 1,
   wherein the irregularities of the surface of the light-transmissive member are formed by (i) portions of the light-diffusing particles exposed from the light-transmissive member and (ii) portions of the light-diffusing particles covered by the light-transmissive member.

3. The light-emitting device of claim 1,
   wherein the light-diffusing particles in the light-transmissive member have a bulk density of 0.1 g/cm$^3$ to 0.7 g/cm$^3$.

4. The light-emitting device of claim 1,
   wherein the light-diffusing particles in the light-transmissive member have a bulk density of 0.1 g/cm$^3$ to 0.2 g/cm$^3$.

5. The light-emitting device of claim 1,
   wherein the light-emitting device further comprises a base member having a recess,
   the light-emitting element is disposed on a bottom surface of the recess, and
   the light-transmissive member is disposed in the recess to cover the light-emitting element.

6. The light-emitting device of claim 1,
   wherein the light-transmissive member further contains a phosphor.

7. The light-emitting device of claim 6,
   wherein the phosphor and the light-transmissive member have a specific gravity difference of 0.5 g/cm$^3$ to 10 g/cm$^3$.

8. The light-emitting device of claim 7,
   wherein, on the surface of the light-transmissive member, the light-diffusing particles have a greater particle number density than the phosphor.

9. The light-emitting element of claim 1, wherein the surface of the light-transmissive member has a surface roughness of at least 0.3 μm and at most 0.6 μm.

10. The light-emitting element of claim 1, wherein the light-diffusing particles are aligned in the light-transmissive member in such a way that each of the light-diffusing particles in a line is located adjacent to corresponding two of the light-diffusing particles of an adjacent line.

11. The light-emitting element of claim 1, wherein the light-diffusing particles are aligned in the light-transmissive member in such a way that each of the light-diffusing particles in a line is located adjacent to corresponding one of the light-diffusing particles in an adjacent line.

12. The light-emitting element of claim 1, wherein the light-diffusing particles are aligned in the light-transmissive member in such a way that each of the light-diffusing particles in a line is located adjacent to corresponding two of the light-diffusing particles of an adjacent line or is located adjacent to corresponding one of the light-diffusing particles in the adjacent line.

13. A method for manufacturing a light-emitting device, the method comprising steps of:
    mounting a light-emitting element in a recess of a base member;
    injecting a silicone resin containing light-diffusing particles into the recess, the light-diffusing particles having a particle size of 65 μm to 70 μm;
    causing the light-diffusing particles to float up to a surface of the injected silicone resin; and
    curing the injected silicone resin.

14. The method of claim 13, wherein, in the step of injecting the silicone resin, the silicone resin further contains a phosphor such that the phosphor and the silicone resin have a specific gravity difference of 0.5 g/cm$^3$ to 10 g/cm$^3$.

* * * * *